April 28, 1970 H. CZERNY 3,509,423

CIRCUIT SYSTEM FOR THE REMOTE TRANSMISSION
AND AMPLIFICATION OF A SIGNAL
Filed April 10, 1968

INVENTOR:
Heribert Czerny
BY
Darbo, Robertson & Vandenburgh,
Attys

United States Patent Office 3,509,423

Patented Apr. 28, 1970

3,509,423

CIRCUIT SYSTEM FOR THE REMOTE TRANSMISSION AND AMPLIFICATION OF A SIGNAL

Heribert Czerny, Dusseldorf, Germany, assignor of one-half to W. H. Joens & Co. GmbH, Dusseldorf, Germany Filed Apr. 10, 1968, Ser. No. 720,131
Claims priority, application Germany, Apr. 12, 1967, J 33,416
Int. Cl. H02h 7/00
U.S. Cl. 317—16 4 Claims

ABSTRACT OF THE DISCLOSURE

A circuit system for the remote transmission and amplification of a signal with a signal generator which varies its output resistance and an amplifier with sweep characteristics, connected to a voltage divider which contains the signal generator and said amplifier being connected to said signal generator via a transmission line and adapted to assume a first condition when the signal generator has a high output resistance above a threshold value and adapted to assume a second condition when the signal generator has a low output resistance below a threshold value, characterized in that a shorting circuit normally of high resistance, is connected to the amplifier input in parallel to the signal generator and on the amplifier side of the line, said shorting circuit being adapted to assume a low resistance below the aforementioned threshold value in the event of an open circuit occurring on the line.

The invention relates to a circuit system for the remote transmission and amplification of a signal with a signal generator which varies its output resistance, and an amplifier with sweep characteristics, connected to a voltage divider which contains the signal generator, and said amplifier being connected to said signal generator via a transmission line and being adapted to assume a first condition when the signal generator has a high output resistance above a threshold value and adapted to assume a second condition when the signal generator has a low output resistance below a threshold value.

Typical applications of such circuits arise in conjunction with an oscillator whose internal resistance is varied due to the entry of a metal control vane which attenuates the oscillator oscillations. Such oscillators are used particularly for regulators the oscillator being mounted on a set valve pointer and the control vein being mounted on a measured value pointer so that the measured value pointer is inductively scanned and is provided with a signal on reaching the set value. Such oscillator arrangements are also referred to as "inductive switches." The prior art discloses inductive switches whose oscillators have a tendency to assume a high resistanceon being attenuated. Switches of the aforementioned kind are also known which have a tendency to assume low resistance values as the result of being attenuated. Normally, the oscillators are in the undamped condition. On reaching the set value, the measured value pointer enters with the vane into the inductive switch thus triggering a switching function. For example, in a temperature regulating system the heating can be switched off when the set value is reached. Serious disadvantages may occur if the switching operation does not take place.

Transmission from the signal generator, that is to say from the inductive switch, to the amplifier is frequently performed over transmission lines of substantial length. It is possible for faults to occur in such a transmission line, for example it is possible for a short circuit to occur between the two wires of the transmission line or the transmission line may be interrupted by a defect (e.g., break). The inductive switch may be so constructed as to assume high resistance values when being damped by the vane. If in such a case a short circuit should occur in the transmission line, the amplifier will not detect the tendency to assume high resistance values. Accordingly, a regulator will not respond when a set value is reached so that the measured value will continue to rise beyond the set value. If instead an inductive switch is used which assumes low resistance value when the oscillator is damped, the amplifier would in such case be unable to detect such a tendency towards low resistance values if an open circuit occurred in the transmission line. Since short circuits and open circuits of the transmission lines are faults of approximately equal probability, there will be no protection against dangerous malfunctioning of the system due to line defects.

The object of the invention is to provide a circuit system of the kind heretofore described in which protection against dangerous malfunctioning is provided with any kind of line fault.

It is a particular purpose of the invention to provide an arrangement of the kind heretofore described in which a line short circuit and a line open circuit will produce the same amplifier output.

According to the invention this is achieved in that a shorting circuit, normally of high resistance, is connected to the amplifier input in parallel to the signal generator and on the amplifier side of the line, said shorting circuit being adapted to assume a low resistance below the aforementioned threshold value, in the event of an open circuit occurring in the line.

It is possible to arrange that the "critical condition," at which a switching operation should take place in order to avoid serious disadvantages, is associated with the low resistance condition of the signal generator. The switching function concerned will therefore be triggered when this condition occurs. For example, the heating system will be switched off when the set value of the temperature is reached. The same condition applies if a short circuit occurs in the line which affects the amplifier in the same way as the low resistance signal generator. The shorting circuit will also assume low resistance value in the event of an open circuit in the tranmission line. Both kinds of line fault therefore simulate a "critical condition" and trigger a corresponding reaction. This is possible because both kinds of line faults act in identical manner on the amplifier by virtue of a corresponding circuit being connected to the input.

The invention is particularly advantageous if the signal generator is an oscillator whose internal resistance becomes low on the entry of a metal control vane for attenuating the oscillator oscillations.

The shorting circuit may incorporate a transistor whose emitter-collector connection is connected to an amplifier input and which is connected via a resistor to the supply voltage of the amplifier and whose base can be driven by a Zener diode which is connected in parallel to the signal generator output and on the amplifier side of the transmission line.

When the signal generator is connected the voltage across the Zener diode is insufficient to render same conductive. When the line is open circuited, the voltage across the Zener diode, rising towards the supply voltage, becomes so large as to render the Zener diode conductive and accordingly driving the transistor at the input of the amplifier into its conductive state. Accordingly it will assume low resistance values and the amplifier will sweep into the other condition. Under normal circumstances the transistor as well as the Zener diode is driven to cut off and will have a high resistance so that the normal functioning of the system is not impaired in any way.

An embodiment of the invention will now be described by way of example with reference to the accompanying drawings in which.

Figure 1:
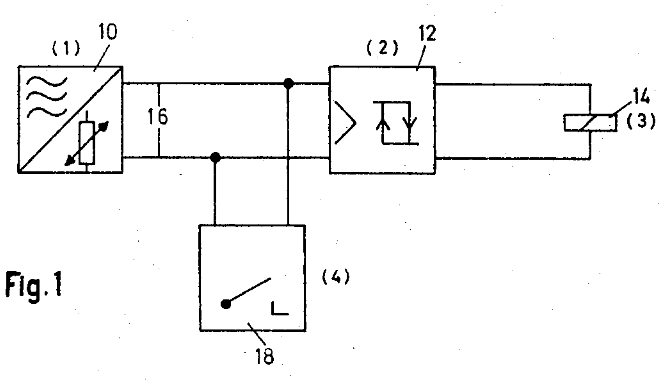
FIGURE 1 is a block circuit diagram.

The numeral 10 refers to an inductive switch which may be of conventional construction and is adapted to have a low resistance output when its oscillator is damped. The switch 10 is connected in a voltage divider circuit to the input of an amplifier 12 having sweep characteristics. A relay 14 is connected to the output circuit of the amplifier 12. The arrangement is so adapted that when the oscillator of the inductive switch 10 is damped, said switch will have a low resistance value and the relay 14 is deenergised. The oscillator and "inductive switch" 10 is connected to the amplifier 12 via a twin core transmission line. A safeguard circuit 18 is connected to the input of the amplifier 12, on the amplifier side of the transmission line 16 and in parallel to the inductive switch 10 via said transmission line, said circuit 18 being adapted to respond to the condition of the line 16 so that in the event of a defect of a first kind (open circuit of the line) it will simulate the effect of a line fault of a second kind (short circuit) so that the last-mentioned defect occurs with each kind of line fault. Measures must then be taken to ensure that this condition is associated with the "critical condition" of the inductive switch, for example "reaching of the set value." The system will then respond whenever the set value is reached and it will also respond to each fault in the line 16 so that line faults cannot cause the set value being exceeded.

Figure 2:
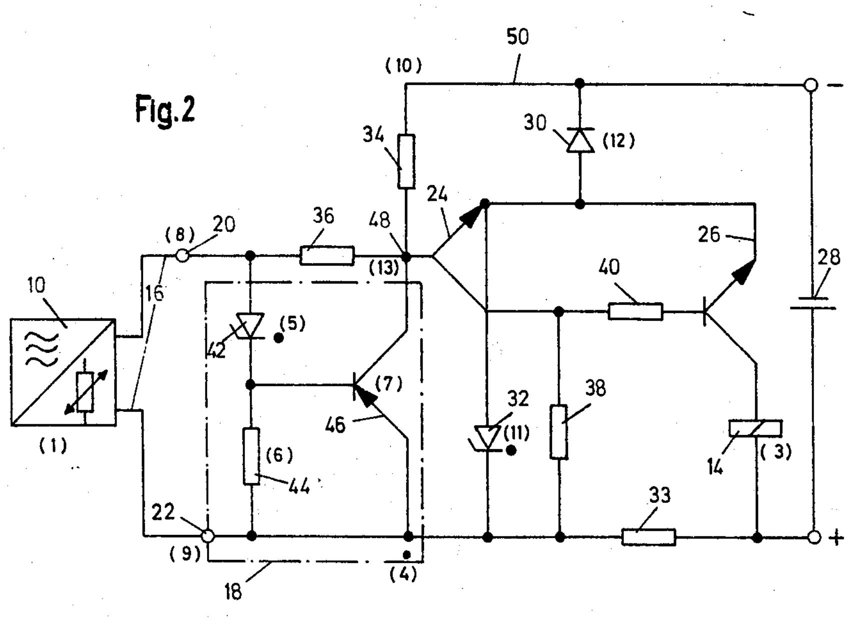
FIGURE 2 shows circuit details of the arrangement of FIGURE 1.

The details of the circuit are illustrated in FIGURE 2.

The inductive switch 10, not shown in detail, is connected via the line 16 to the terminals 20, 22. The amplifier 12 comprises a transistor 24 and a transistor 26, fed via a diode 30 from a supply voltage source 28. The supply voltage is stabilised by a Zener diode 32. The numeral 33 refers to a stabiliser resistor.

The stabilised supply voltage also feeds a voltage divider comprising the resistors 34 and 36 as well as the internal resistance of the inductive switch 10. The base of the transistor 24 is connected to the voltage divider between the resistors 34 and 36. If the internal resistance of the inductive switch 10 varies due to damping of the oscillator, the base potential of the transistor 24 will shift towards positive values thus causing the transistor 24 to become conductive. Accordingly, a voltage appears across the collector resistor 38 of the transistor 24. The potential applied to the base of the transistor 26, connected via a resistor 40 to the collector of the transistor 24, is shifted to negative values thus causing the transistor 26 to be driven to cut off. Accordingly the relay 14 connected in the collector circuit of the transistor 26 will be deenergised.

A serial connection of a Zener diode 42 and of a resistor 44 is connected between the terminals 20 and 22. The base of a transistor 46 is connected between the Zener diode 42 and the resistor 44, said transistor being connected directly to the input of the amplifier 12, that is to say its collector being connected to the base of the transistor.

Normally, the Zener diode 42 is non-conductive. Under normal operating conditions the voltage between terminals 20 and 22 is approximately 9 v. The Zener diode is constructed with a Zener voltage of 10 v. so that practically no current flows through the Zener diode 42. Accordingly, the transistor 46 will be driven to cut off. When this condition prevails, the shorting circuit formed by the Zener diode 42, the resistor 44 and the transistor 46 will not come into action. If the line 16 has a short circuit, this will have the effect of a low internal resistance of the inductive switch 10. If the line 16 is open circuited on one or both cores, the potential applied to the terminal 20 will tend to rise to the potential of the negative terminal at 50. The voltage between the position 50 and the positive terminal 22 is comprised additively of the Zener voltage of 10 v. of the Zener diode 42, said Zener diode 42 will become conductive and drive the transistor 46. Accordingly, the collector emitter connection thereof will assume a low resistance. The voltage between the terminal 22 and the position 48 between the resistors will then become so small that the threshold value of the amplifier will also be exceeded and the relay 14 will be deenergised in the manner heretofore described. The resistor 44 will determine the operating point of the transistor 46.

I claim:

1. In an apparatus for the remote transmission and amplification of a signal from the output of signal generator means over transmission lines connected to said output and to the input of amplifier means, wherein said signal generator means has different output resistances, and said amplifier means has sweep characteristics and assumes a first condition when said output resistance is a high resistance above a threshold value and assumes a second condition when said output resistance is a low resistance below a threshold value, the improvement comprising:

shorting circuit means normally having a high resistance, said shorting circuit means being connected to the amplifier input in parallel with the line and at the input end of the line for applying a low resistance below said threshold value across said input in response to an open circuit occurring on the line.

2. In an apparatus as set forth in claim 1, wherein said amplifier means has power supply connections; and the shorting circuit means includes transistor having a base, an emitter and a collector, said emitter and collector being respectively connected to said input, means including a resistor connecting said emitter and collector to said power supply connections, and means including a Zener diode connected across said line and connected to said base.

3. In an apparatus as set forth in claim 1, wherein said signal generator means is an oscillator.

4. In a control apparatus comprising a signal generator means having an output connected by a transmission line to the input of a signal responsive means, wherein the signal generator means has an output which varies in resistance above and below a threshold value to produce first and second command signals depending upon whether the resistance is above or below said threshold value respectively, and said responsive means initiates a potentially safe operation in response to one of said signals and initiates a potentially critical operation in response to the other of the signals, and wherein the first signal would be simulated by an open circuit condition in the line and the second signal would be simulated by a short circuit condition in the line, the improvement comprising:

safeguard circuit means connected to the input of the signal responsive means in parallel with the line and at the input end of the line, said safeguard means being responsive to the condition in the line which would simulate said other signal for producing a resistance at said input corresponding to the resistance which produces said one signal, whereby the potentially safe operation is initiated by both an open circuit in the line and by a short circuit in the line.

References Cited

UNITED STATES PATENTS

| | | | |
|---|---|---|---|
| 2,997,661 | 8/1961 | Welker | 331—62 |
| 3,005,166 | 9/1961 | Savory | 331—62 |

LEE T. HIX, Primary Examiner

H. FENDELMAN, Assistant Examiner

U.S. Cl. X.R.

317—33

UNITED STATES PATENT OFFICE

CERTIFICATE OF CORRECTION

Patent No. 3,509,423 Dated April 28, 1970

Inventor(s) Heribert Czerny

It is certified that error appears in the above-identified patent and that said Letters Patent are hereby corrected as shown below:

Column 1, line 50 "vein" should be -vane-;

Column 1, line 56, "resistanceon" should be -resistance on-;

Column 2, line 52, "value" should be -values-;

Column 4, line 21, after "voltage of", insert -the Zener diode 32 of 12 V and the voltage across the diode 30 of 0.8 V. As soon as the voltage between the terminals 20 and 22 has reached the Zener voltage of-.

SIGNED AND SEALED

OCT 6 -[illegible]

Oct 6 - 1970

(SEAL)

Attest:

Edward M. Fletcher, Jr.
Attesting Officer

WILLIAM E. SCHUYLER, JR.
Commissioner of Patents

FORM PO-1050 (10-69)

USCOMM-DC 60376-P69
☆ U.S. GOVERNMENT PRINTING OFFICE : 1969 O—366-334